(12) United States Patent
Chang

(10) Patent No.: US 12,302,546 B2
(45) Date of Patent: May 13, 2025

(54) SEMICONDUCTOR MEMORY STRUCTURE

(71) Applicant: Winbond Electronics Corp., Taichung (TW)

(72) Inventor: Hao-Chuan Chang, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 468 days.

(21) Appl. No.: 17/891,925

(22) Filed: Aug. 19, 2022

(65) Prior Publication Data
US 2023/0217641 A1 Jul. 6, 2023

(30) Foreign Application Priority Data

Jan. 4, 2022 (TW) .................................. 111100159

(51) Int. Cl.
H10B 12/00 (2023.01)
G11C 5/06 (2006.01)
(52) U.S. Cl.
CPC ............. H10B 12/00 (2023.02); G11C 5/063 (2013.01)
(58) Field of Classification Search
CPC .... H10B 12/00; H10B 12/34; H10B 12/0335; H10B 12/033; G11C 5/063
USPC ....................................................... 257/296
See application file for complete search history.

(56) References Cited

U.S. PATENT DOCUMENTS 8,357,969 B2    1/2013  Sung
11,751,380 B2 * 9/2023  Chang ................ H10B 12/0335
                                                           257/296

FOREIGN PATENT DOCUMENTS

TW          200901376 A      1/2009

* cited by examiner

Primary Examiner — Igwe U Anya
(74) Attorney, Agent, or Firm — Muncy, Geissler, Olds & Lowe, P.C.

(57) ABSTRACT

A semiconductor memory structure includes a semiconductor substrate, a bit line disposed on the semiconductor substrate, a dielectric liner disposed on a sidewall of the bit line and a capacitor contact disposed on a side of the bit line. The dielectric liner includes a first nitride liner disposed on a sidewall of the bit line, an oxide liner disposed on a sidewall of the first nitride liner, and a second nitride liner disposed on a sidewall of the oxide liner. The capacitor contact includes a semiconductor plug disposed on the semiconductor substrate, a metal plug disposed on the semiconductor plug, a metal silicide liner including a sidewall portion and a bottom portion extending along the sidewall and the bottom of the metal plug respectively, and a nitride layer disposed on the metal silicide liner. The sidewall portion is disposed directly above the second nitride liner.

20 Claims, 10 Drawing Sheets

SEMICONDUCTOR MEMORY STRUCTURE

CROSS REFERENCE TO RELATED APPLICATIONS

This application claims priority of Taiwan Patent Application No. 111100159, filed on Jan. 4, 2022, the entirety of which is incorporated by reference herein.

BACKGROUND

Technical Field

The present disclosure relates to a semiconductor memory structure, and in particular it relates to a contact structure of dynamic random access memory.

Description of the Related Art

Dynamic random access memory (DRAM) is widely used in consumer electronic products. In order to increase the device density in the DRAM device and improve the performance of these devices, current DRAM manufacturing technology continues to trend towards miniaturization of the devices.

However, as the dimensions of the device continue to shrink, many challenges arise. For example, in the semiconductor manufacturing process, there is a small contact area between the semiconductor plug and the metal plug, and so a large capacitance value is generated between the bit lines. In addition, when the polysilicon is annealed, since the surrounding materials are not the same, the stress and the growth temperature are not the same. Thus, the silicide layer is prone to non-uniformity at the corners. Therefore, the industry still needs to improve the technology used to process dynamic random access memory to overcome the problems caused by shrinking device sizes.

BRIEF SUMMARY

In accordance with some embodiments of the present disclosure, a semiconductor memory structure is provided. The semiconductor memory structure includes a semiconductor substrate, a bit line disposed on the semiconductor substrate, a dielectric liner disposed on a sidewall of the bit line and a capacitor contact disposed on a side of the bit line. The dielectric liner includes a first nitride liner disposed on a sidewall of the bit line, an oxide liner disposed on a sidewall of the first nitride liner, and a second nitride liner disposed on a sidewall of the oxide liner. The capacitor contact includes a semiconductor plug disposed on the semiconductor substrate, a metal plug disposed on the semiconductor plug, a metal silicide liner including a sidewall portion and a bottom portion that respectively extend along a sidewall and a bottom of the metal plug, and a nitride layer disposed on the metal silicide liner. The sidewall portion is disposed directly above the second nitride liner.

BRIEF DESCRIPTION OF THE DRAWINGS

To make the features and advantages of the present invention more obvious and understandable, different embodiments are specially cited below, and detailed descriptions are as follows in conjunction with the accompanying drawings.

DETAILED DESCRIPTION

Figure 1:
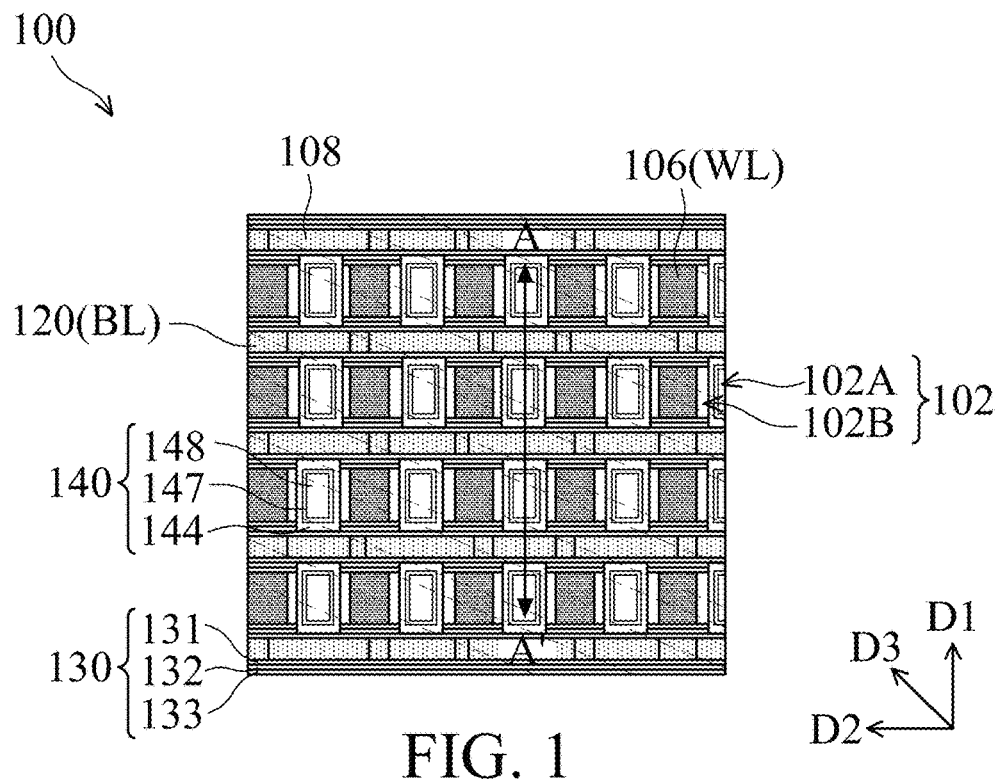
FIG. 1 illustrates a top view of semiconductor memory structure according to some embodiments of the present disclosure.

FIG. 1 illustrates a top view of semiconductor memory structure according to some embodiments of the present disclosure. In some embodiments, the semiconductor memory structure 100 is a portion of a dynamic random access memory (DRAM) array. In some embodiments, semiconductor memory structure 100 includes a semiconductor substrate 102, word lines 106, bit line contacts 108, bit lines 120, dielectric liners 130, and capacitor contacts 140.

The semiconductor substrate 102 includes an active region 102A and an isolation region 102B surrounding the active region 102A. The dielectric liner 130 includes a pair of nitride liners 131, 133 and an oxide liner 132 sandwiched between the pair of nitride liners 131, 133. The capacitor contact 140 includes a metal plug 148 and an adhesive layer 147 and a nitride layer 144 surrounding the metal plug 148.

In this top view embodiment, the word line 106 extends along a first direction D1, the bit line 120 extends along a second direction D2, and the active region 102A extends along a third direction D3. In this embodiment, the first direction D1 is perpendicular to the second direction D2, and the third direction D3 (that is, the extending direction of the active region 102A) and the second direction D2 present an angle of about 10-40°, such as 20°, in order to improve the integration of elements.

In this top-view embodiment, the capacitor contact 140 extends through the second nitride liner 133 and oxide liner 132 but not penetrates through first nitride liner 131 in a first direction D1. In this embodiment, the nitride layer 144 is in direct contact with the first nitride liner 131, the oxide liner 132, and the second nitride liner 133.

It should be noted that FIG. 1 only shows some elements of a dynamic random access memory (DRAM) to simplify the figures. Subsequent figures are cross-sectional views (a plane formed by the first direction D1 and the height direction Z) along the cross sectional line A-A' in FIG. 1 to facilitate the description of the method of forming the semiconductor memory structure.

FIGS. 2-14 illustrate cross-sectional views of forming semiconductor memory structure at different stages, according to some embodiments of the present disclosure.

Figure 2:
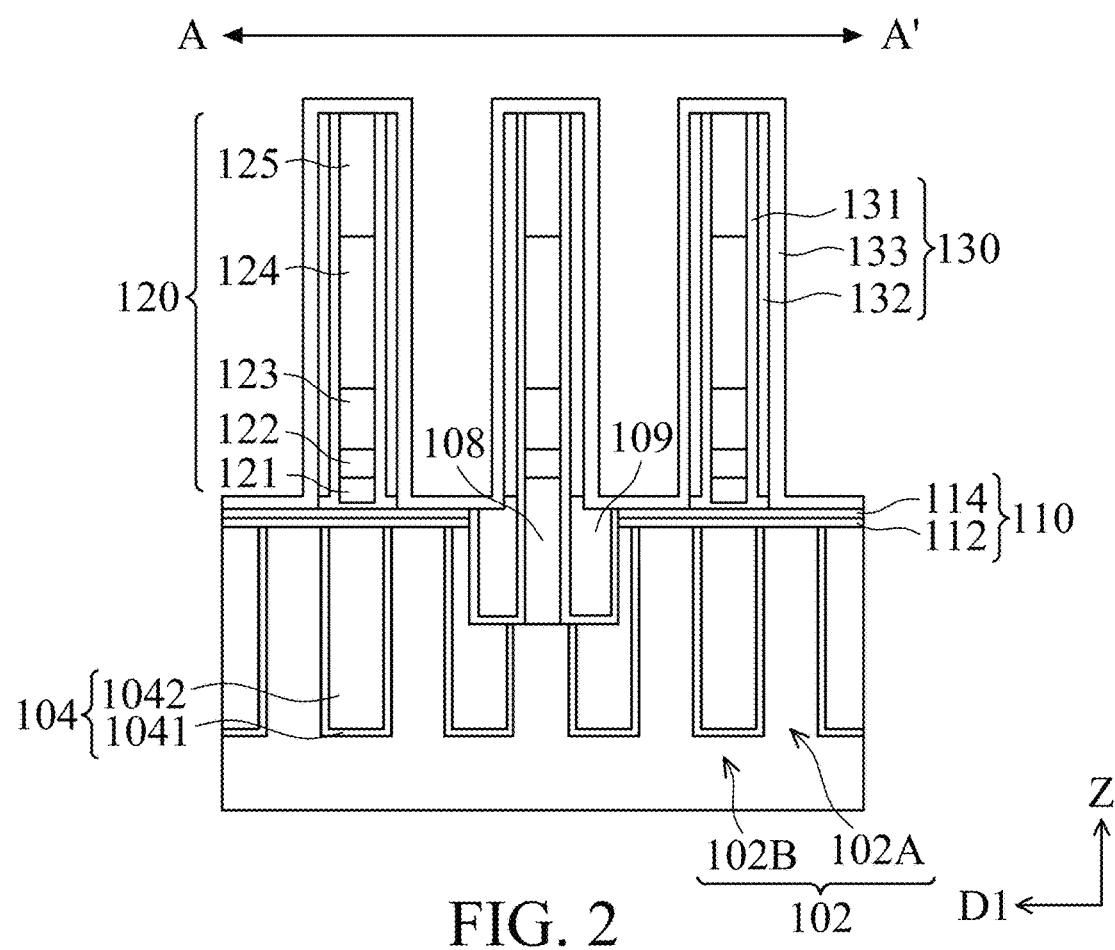
FIGS. 2-14 illustrate cross-sectional views of forming semiconductor memory structure at different stages, wherein the extending portion of the semiconductor material is completely silicided, according to some embodiments of the present disclosure.

As shown in FIG. 2, a semiconductor substrate 102 is provided. The semiconductor substrate 102 includes an active region 102A and an isolation region 102B, which are arranged in a staggered manner. In FIG. 2, an isolation member 104 is disposed in the isolation region 102B of the semiconductor substrate 102, and the isolation member 104 includes an isolation liner 1041 and an isolation filler 1042.

In some embodiments, the word lines (not shown) are buried in the active region of the semiconductor substrate. In some embodiments, the word line acts as a gate and includes a gate dielectric layer, a gate liner, and a gate electrode (not shown). It should be noted that since the word line 106 in FIG. 1 extends along the first direction D1, and the cross sectional line A-A' does not touch the word line 106, the word line is not shown in FIG. 2.

In FIG. 2, the bit line contact 108 is partially embedded in the active region 102A of the semiconductor substrate 102 to facilitate subsequent electrical connection with the bit line 120. In some embodiments, spacers 109 are disposed on both sides of the bit line contact 108 to prevent the bit line contact from being short-circuited by connecting the subsequently formed capacitor contact.

In some embodiments, the bit line contact 108 is doped polysilicon to reduce contact resistance with subsequently formed bit lines. Dopants may include n-type or p-type dopants such as nitrogen, arsenic, phosphorus, antimony ions or boron, aluminum, gallium, indium, boron trifluoride ions ($BF3^+$).

In some embodiments, the spacer 109 is a dielectric material including a nitride, such as silicon nitride.

Please continue to refer to FIG. 2, a cap layer 110 is formed on the semiconductor substrate 102 to protect the elements in the semiconductor substrate from being damaged by subsequent processes. In some embodiments, the cap layer 110 includes an oxide layer 112 and a nitride layer 114.

In some embodiments, the oxide layer 112 includes a silicon oxide layer formed of tetraethylorthosilicate (TEOS). In some embodiments, the nitride layer 114 includes silicon nitride (SiN) or silicon oxynitride (SiON). In some embodiments, the oxide layer 112 and the nitride layer 114 may be sequentially formed by the deposition processes as described above.

Next, as shown in FIG. 2, the step of forming the bit line 120 on the semiconductor substrate 102 also includes forming the bit line 120 on the bit line contact 108. In some embodiments, the bit line 120 on the bit line contact 108 includes conductive layers 122 and 123 on the bit line contact 108, and dielectric layers 124 and 125 on the conductive layers 122 and 123. The bit line 120 on the isolation member 104 includes a dielectric layer 121 on the cap layer 110, conductive layers 122 and 123 on the dielectric layer 121, and dielectric layers 124 and 125 on the conductive layers 122 and 123. By the uppermost dielectric layers 144 and 145, the underlying layers (such as the conductive layers 122 and 123) may be protected from being damaged in the subsequent processes.

In some embodiments, the conductive layers 122 and 123 include doped polysilicon, metal, or metal nitride, such as tungsten (W), titanium (Ti), and titanium nitride (TiN). In some embodiments, the dielectric layers 121, 124 and 125 include nitrides such as silicon nitride or the like.

Next, as shown in FIG. 2, a dielectric liner 130 is formed on the two sidewalls and the top surface of the bit line 120 and on the cap layer 110, which may prevent the bit line 120 from being short-circuited by directly contacting the subsequently formed capacitor contacts.

In some embodiments, the dielectric liner 130 disposed on the two sidewalls of the bit line 120 includes a first nitride liner 131 and a second nitride liner 133, and an oxide liner disposed therebetween. The oxide liner 132 is used to prevent parasitic capacitances from being generated between the bit lines 120 and the capacitor contacts that are formed subsequently. In an alternative embodiment, the oxide liner 132 may also be replaced by an air gap.

In some embodiments, the dielectric liner 130 on the top surface of the bit line 120 and on the cap layer 110 only includes the second nitride liner 133 to protect the underlying film from being affected by the subsequent processes.

In some embodiments, the first nitride liner 131 and the oxide liner 132 are deposited by a deposition process, and then the etch back process is used to remove the first nitride liner 131 and the oxide liner 132 on the top surface of the bit line 120 and on the top surface of the cap layer 110. Finally, the nitride liner 133 is deposited by the deposition process, so that the oxide liner 132 is sandwiched between the first nitride liner 131 and the second nitride liner 133.

Next, FIGS. 3-13 are cross-sectional views of forming the capacitor contact 140 on a side of the bit line 120 at different stages.

Figure 3:
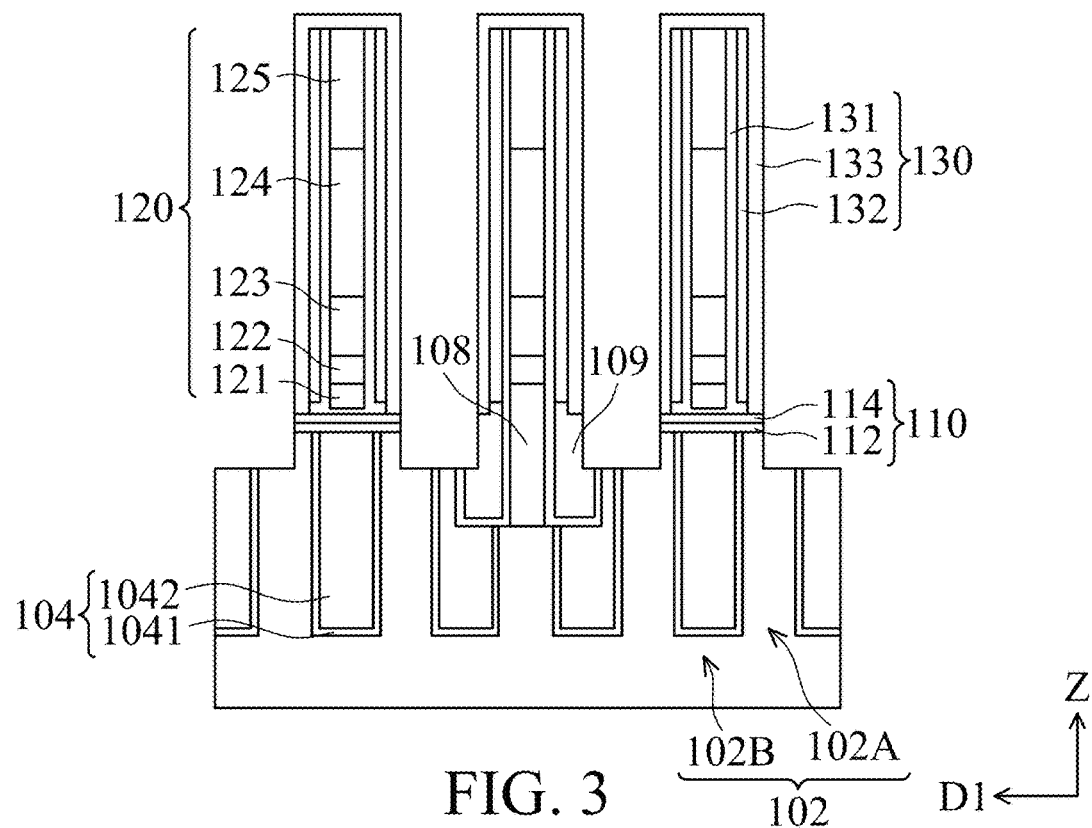

As shown in FIG. 3, the cap layer 110 and the semiconductor substrate 102 are etched (including etching a portion of the spacer 109) along the sidewall of the dielectric liner 120 by an etch-back process, so that the subsequently formed capacitors are electrically connected with the active region 102A of the semiconductor substrate 102.

Figure 4:
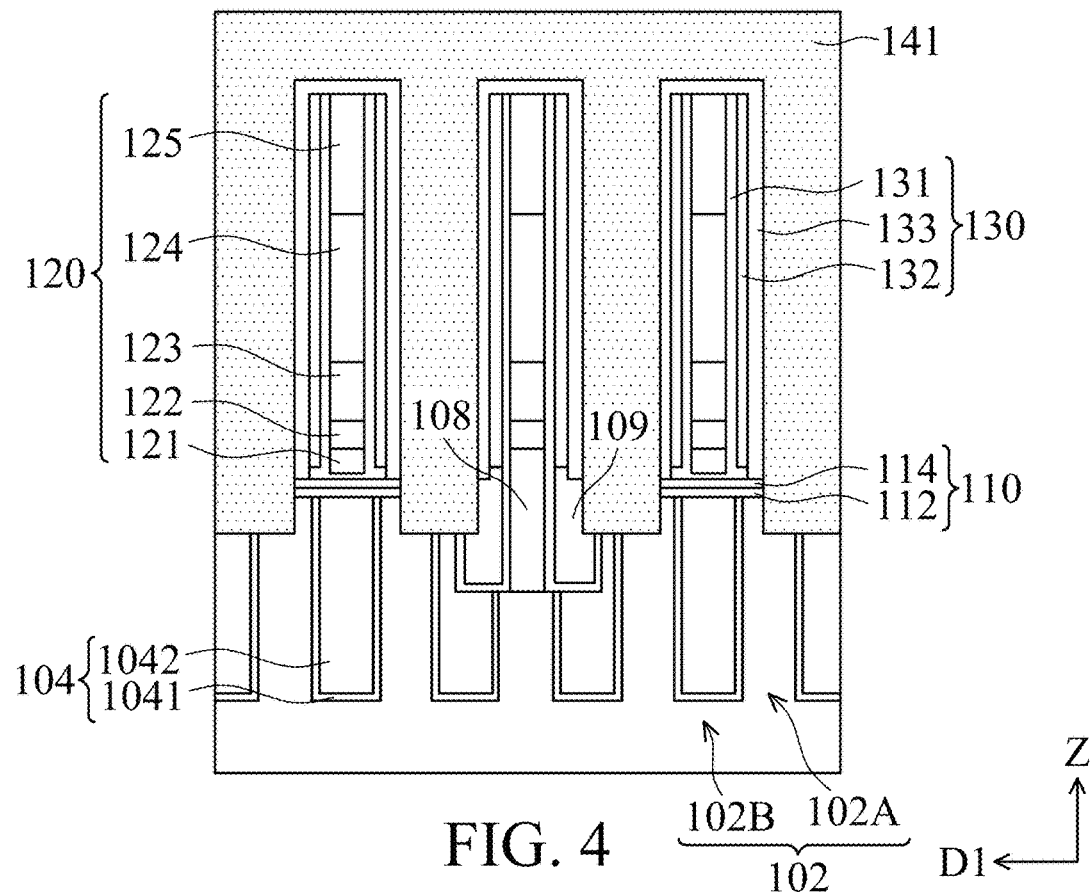
Figure 5:
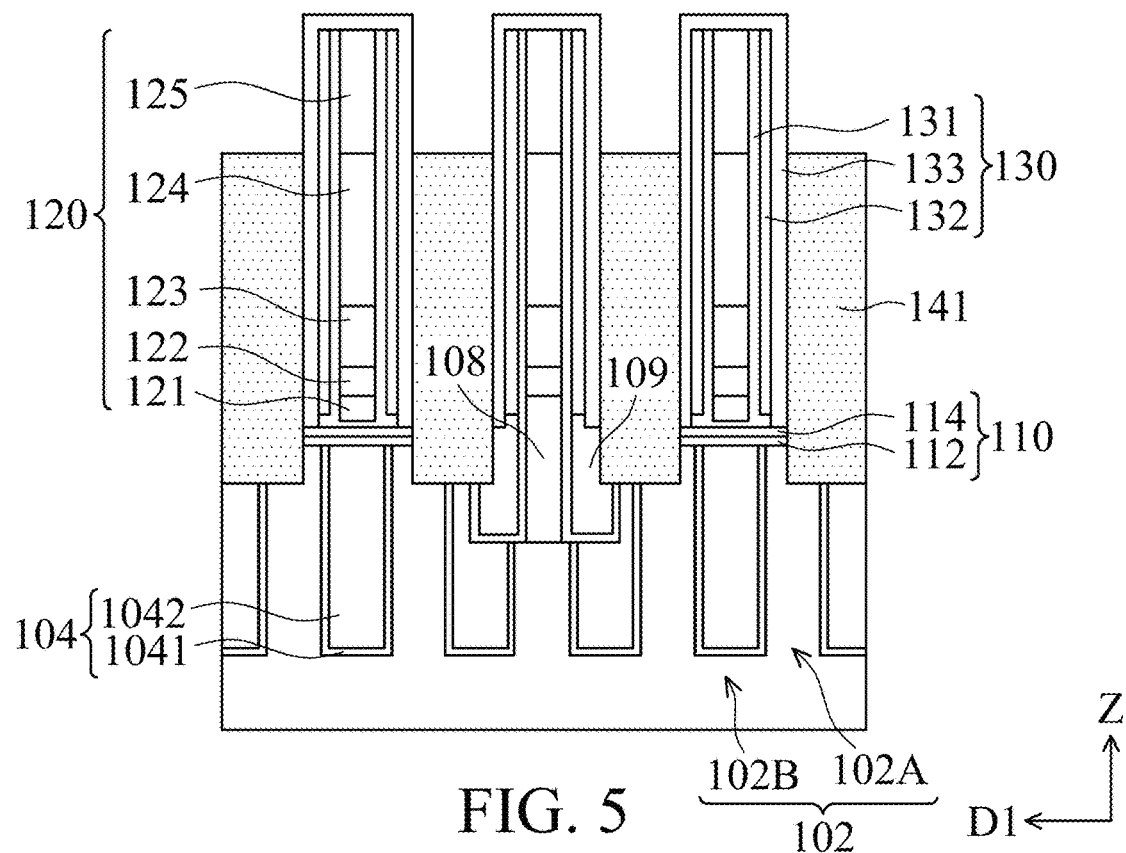

Next, as shown in FIGS. 4-5, a semiconductor material 141 is deposited by a deposition process, and then the semiconductor material 141 is etched by an etch-back process. By doing so, the top surface of the semiconductor material 141 is lower than the top surface of the dielectric layer 125 of the bit line 120, and higher than the conductive layer 123 of the bit line 120. In some embodiments, the semiconductor material 141 includes doped polysilicon.

Figure 6:
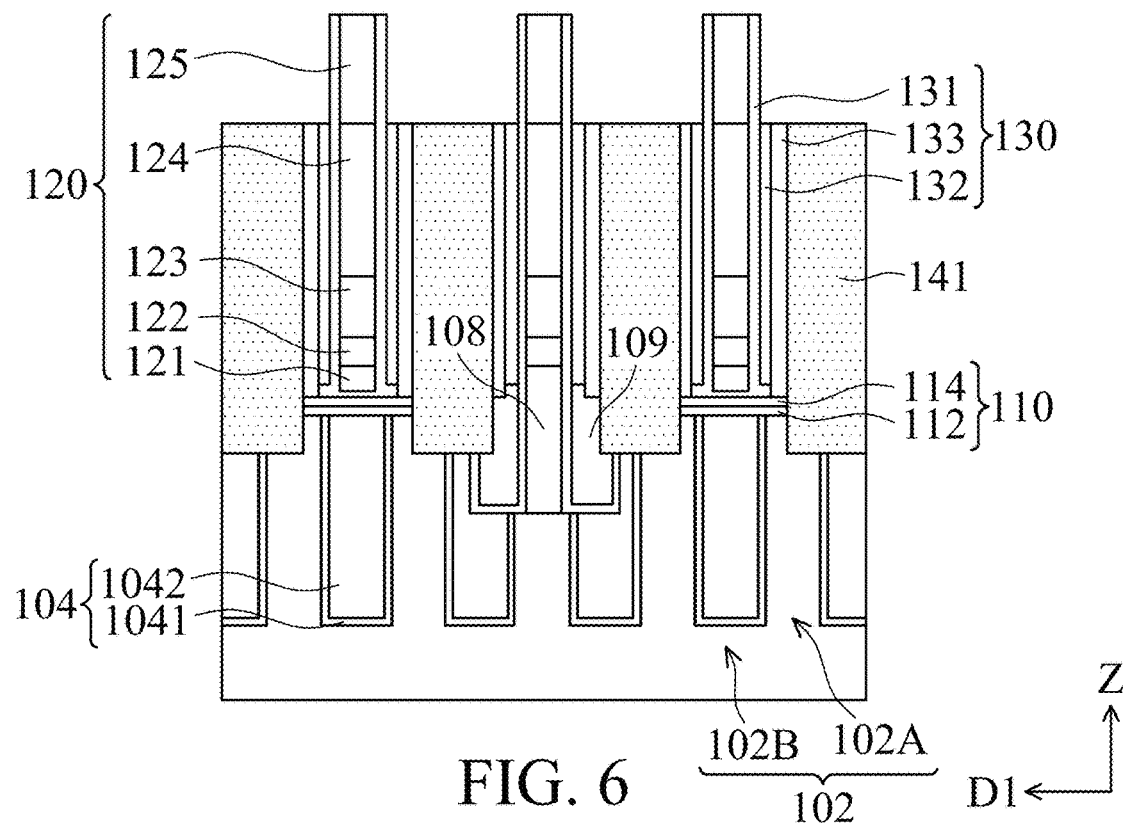

Next, as shown in FIG. 6, the second nitride liner 133 and the oxide liner 132 on the semiconductor material 141 are removed by an etching process. In this embodiment, the etchant comprises SiCoNi to etch the second nitride liner 133 and oxide liner 132 without substantially etching the semiconductor material 141. In addition, the first nitride liner 131 may be used as an etch stop layer, and the etching process can be stopped by an etching signal. In this way, the first nitride liner 131 may be retained on the sidewalls of the entire bit line 120 and protect the bit line 120 from being affected by the subsequent processes. Here, the removal of the second nitride liner 133 and the oxide liner 132 may include removing a portion of the uppermost dielectric layer 125 of the bit line 120. That is, the height of the bit line 120 may be slightly decreased due to the etching process. In other embodiments, the removal of the second nitride liner 133 and the oxide liner 132 does not include removing a portion of the bit line 120. That is, the height of the bit line 120 may not be affected by the etching process.

Figure 7:
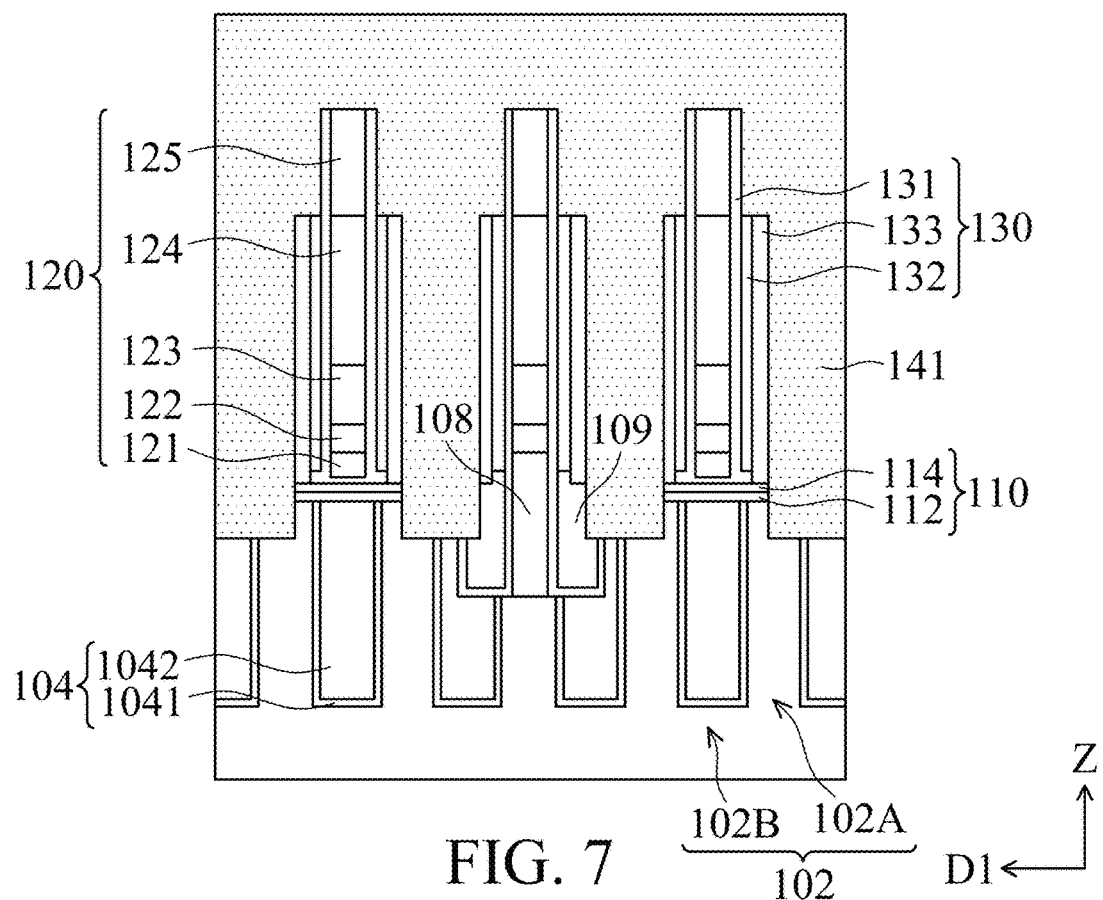
Figure 8:
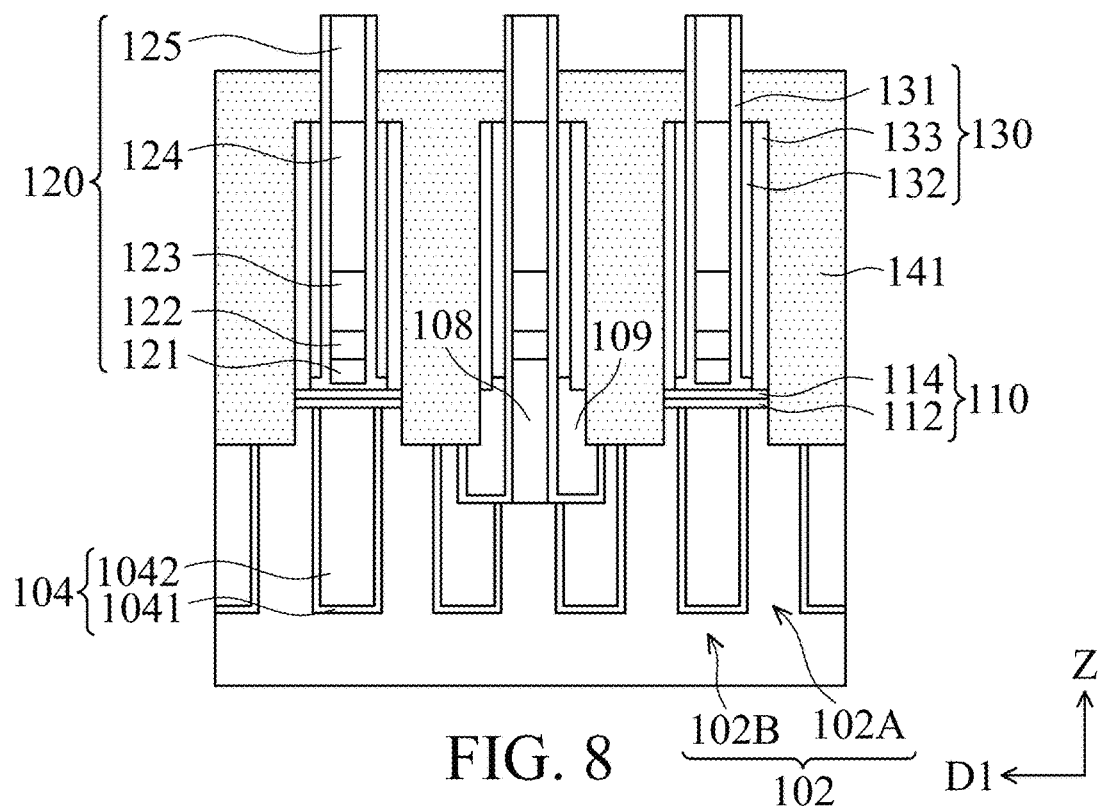

Next, as shown in FIGS. 7-8, the semiconductor material 141 is re-deposited by the deposition process, and the semiconductor material 141 is etched by the etch-back process again. By doing so, the top surface of the semiconductor material 141 is lower than the top surface of the dielectric layer 125 of the bit line 120 and is higher than the top surfaces of the oxide liner 132 and the second nitride liner 133.

Figure 9:
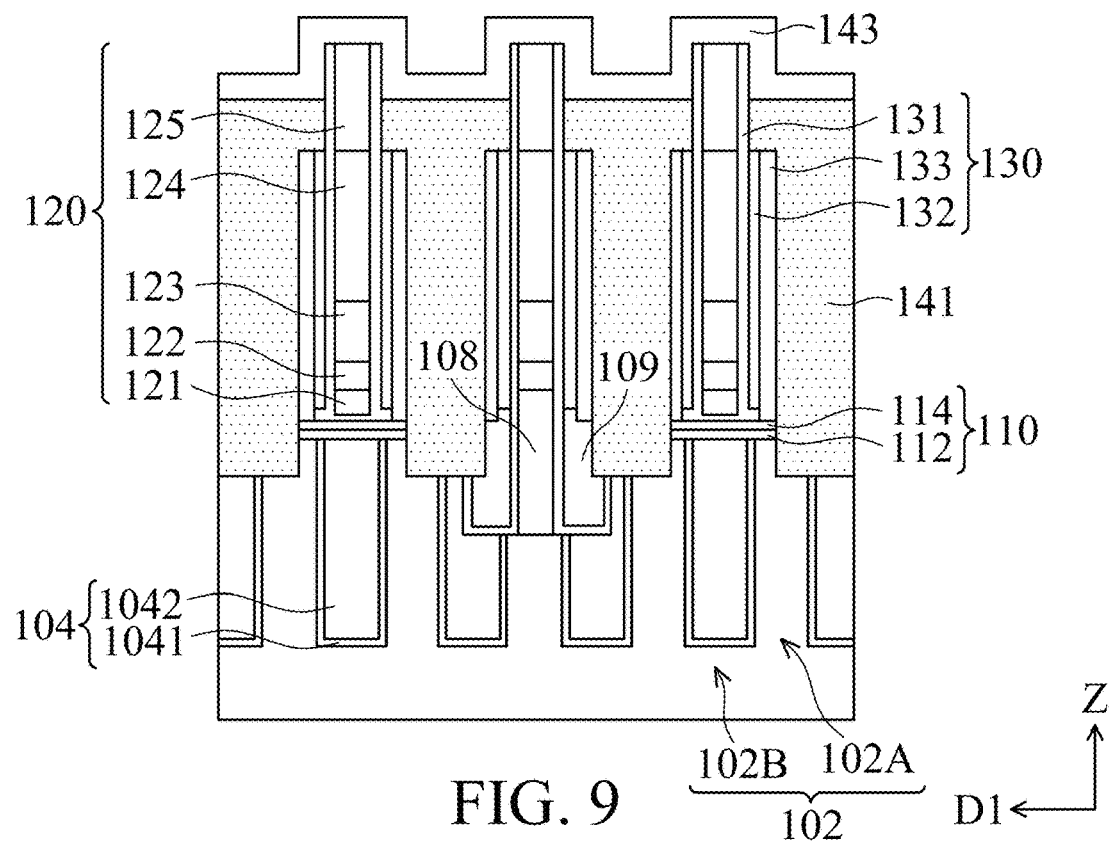
Figure 10:
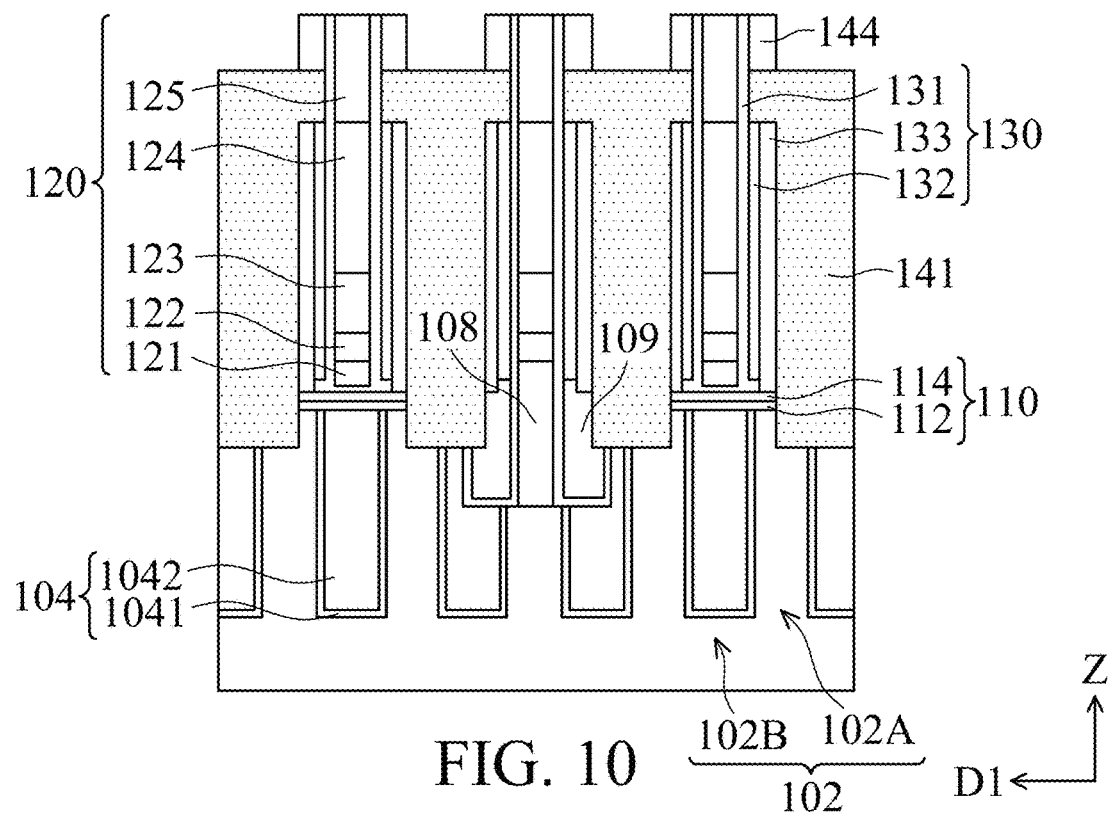

Next, as shown in FIGS. 9-10, a nitride material layer 143 is conformally deposited by the deposition process. Then, the nitride material layer 143 on the top surface of the semiconductor material 141 and on the top surface of the bit line 120 is etched by an etching process until a portion of the top surface of the semiconductor material 141 is exposed, and leaving the nitride layer 144 on both sides of the bit line 120.

In some embodiments, the top surface of the nitride layer 144 is level with the top surfaces of the first nitride liner 131 and the bit line 120, so that the nitride layer 144 has a finer pattern, which is benefit for subsequent definition of the metal silicide liner. In addition, the sidewalls of the nitride layer 144 directly contact the sidewalls of the first nitride liner 131.

By replacing the upper oxide liner 132 with the nitride layer 144 and the semiconductor material 141, subsequent damage to the oxide liner due to a post-clean process may be prevented.

Figure 11:
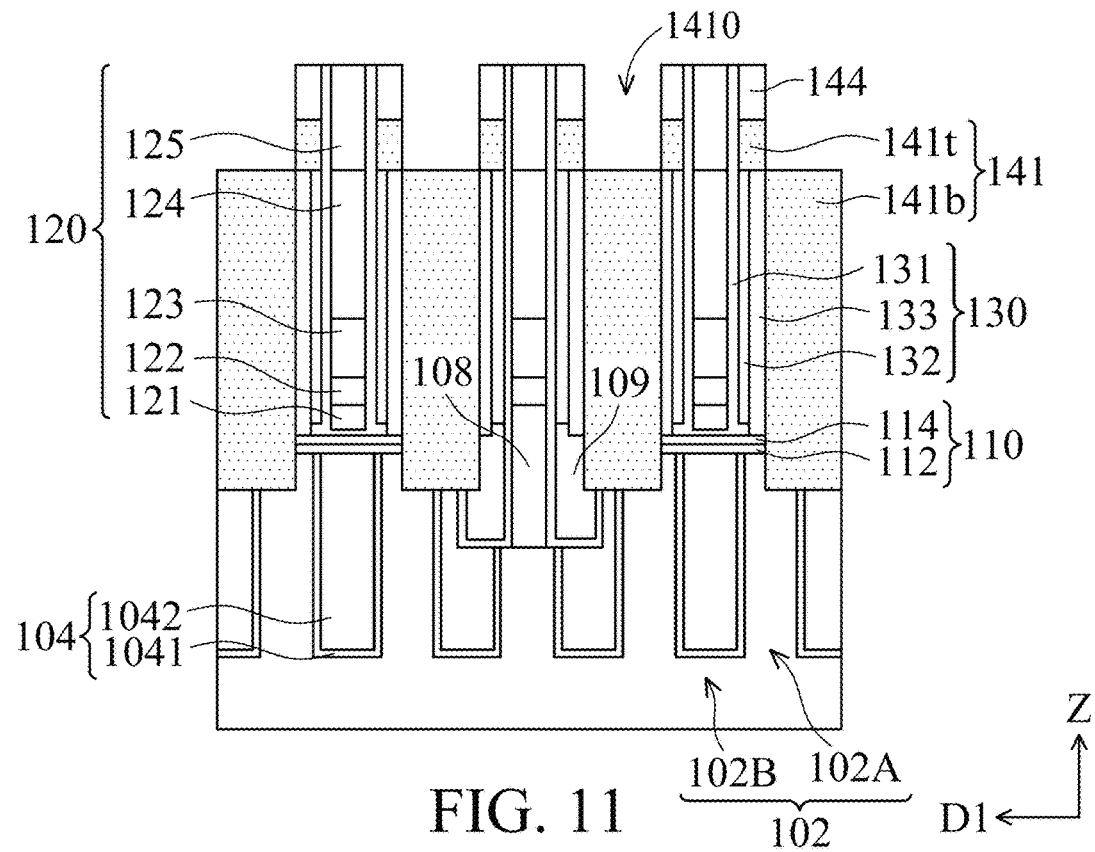

Next, as shown in FIG. 11, using the nitride layer 144 as an etch mask, the semiconductor material 141 is etched by the etching process to form a recess 1410 in the semiconductor material 141. The semiconductor material 141 is divided into the extending portion 141t on the sidewall of the recess 1410 and the body portion 141b under the bottom of the recess 1410. In some embodiments, the top surface of the body portion 141b is lower than the top surface of the extending portion 141t and is higher than the top surface of the conductive layer 123 of the bit line 120. In some embodiments, at least a portion of the body portion 141b and at least a portion of the extending portion 141t will be converted into a metal silicide liner subsequently.

In FIG. 11, the body portion 141b and the extending portion 141t only intersect at one point. That is, the top surface of the body portion 141b is substantially level with the bottom surface of the extending portion 141t. In other embodiments, the body portion 141b and the extending portion 141t are connected to each other by a portion of their sidewalls. In still other embodiments, the body portion 141b and the extending portion 141 are not connected to each other.

Figure 12:
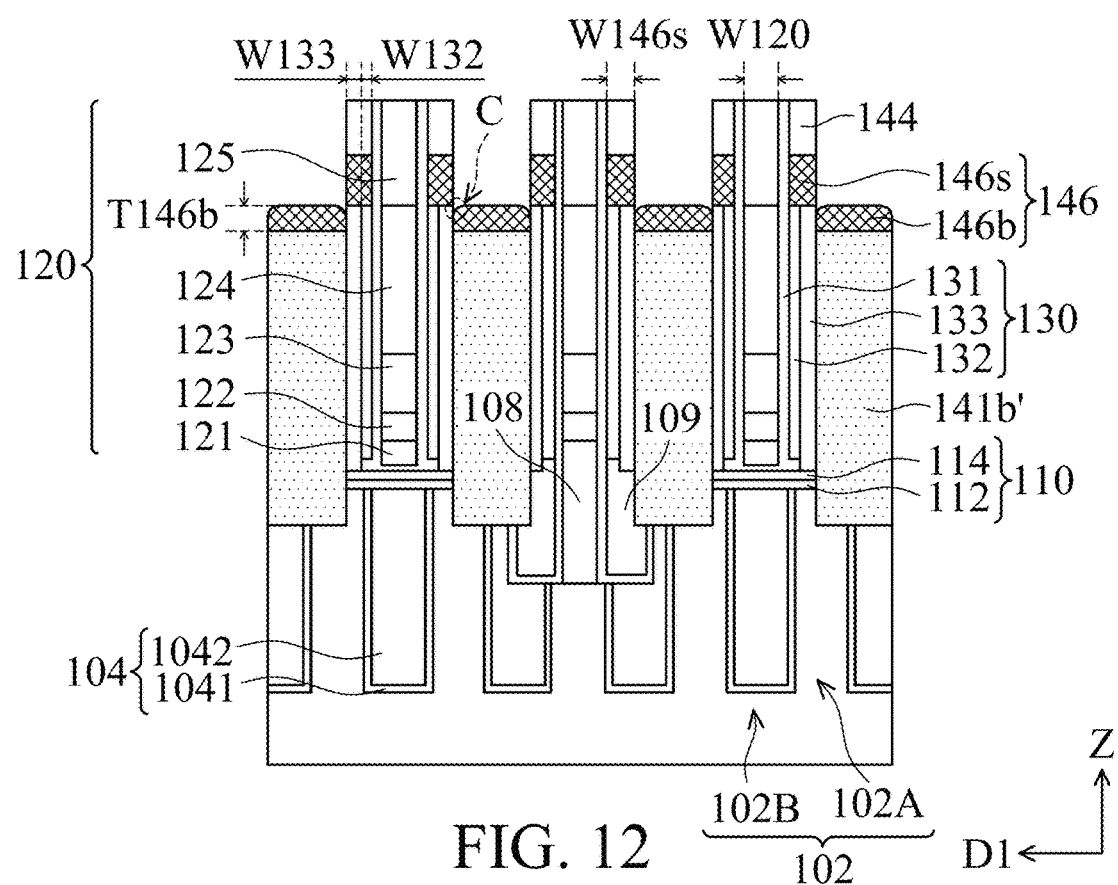

Next, as shown in FIG. 12, a portion of the semiconductor material 141 is converted into a metal silicide liner 146 by a silicidation process to reduce the contact resistance with subsequent metal plugs (not shown). Specifically, the extending portion 141t extending along the side surface of the recess 1410 is completely converted into the sidewall portion 146s of the metal silicide liner 146, and the body portion 141b extending along the bottom of the recess 1410 is partially converted into the bottom portion 146b of the metal silicide liner 146. Here, the remaining semiconductor material 141 is referred to as a semiconductor plug 141, and the remaining body portion 141b is referred to as a body portion 141b'.

In some embodiments, due to the silicidation process, the bottom portion 146b presents curve at the corner C, so the sidewall portion 146s is not in direct contact with the bottom portion 146b. In some embodiments, in the height direction Z, the bottom surface of the sidewall portion 146s is level with the top surface of the bottom portion 146b. It should be noted that here, the top surface of the bottom portion 146b is represented as the top surface of the highest point of the bottom portion 146b.

In some embodiments, in the height direction Z, the sidewall portion 146s is sandwiched between the nitride layer 144 and the second nitride liner 133. In some embodiments, in the height direction Z, the sidewall of the nitride layer 144, the sidewall of the sidewall portion 146s, and the sidewall of the second nitride liner 133 are aligned with each other. That is, in the height direction Z, the nitride layer 144, the sidewall portion 146s and the second nitride liner 133 are arranged from top to bottom. That is, the sidewall portion 146s is located directly above the second nitride liner 133. In some embodiments, the sidewall portion 146s is disposed on the sidewall of the first nitride liner 131, and the bottom portion 146b is disposed on the sidewall of the second nitride liner 133.

In FIG. 12, in the height direction Z, the sidewall portion 146s is disposed directly above the oxide liner 132. That is, the bottom surface of the sidewall portion 146s directly contact the top surface of the oxide liner 132 and the top surface of the second nitride liner 133. In FIG. 12, in the height direction Z, the sidewall of the nitride layer 144, the sidewall of the sidewall portion 146s, and the sidewall of the oxide liner 132 are aligned with each other.

In some embodiments, the silicidation process includes first depositing a metal (such as cobalt) on the semiconductor material 141 including the extending portion 141t and the body portion 141b. The silicidation process further includes performing an annealing process to the metal, and then using a wet etching process to remove the unreacted portion of the metal to form a metal silicide liner 146. In some embodiments, the metal silicide liner 146 includes cobalt silicon (CoSi).

Compared with the semiconductor material only having the body portion, in the embodiment of the present disclosure, the semiconductor material further includes the extending portion, so that the semiconductor material at the corners may have more uniform stress and growth temperature during the silicidation process since contacting the similar material, thereby improving the uniformity of the metal silicide layer. That is, the bottom portion 146b of the metal silicide layer 146 in the embodiment of the present disclosure does not drop significantly at the corner C (the bottom portion 146b only forms a relatively flat arc surface at the corner C), and the uniformity of the bottom portion 146b may be improved.

In the embodiment of the present disclosure, the sidewall portion of the metal silicide liner may increase the contact area with the subsequently formed metal plug, so as to further reduce the contact resistance.

In some embodiments, since the extending portion 141t and the body portion 141b of the semiconductor material 141 are simultaneously converted into the sidewall portion 146s and the bottom portion 146b of the metal silicide liner 146 through the silicidation process, the width W146s of the sidewall portion 146s is substantially equal to the thickness T146 of the bottom portion 146b.

In some embodiments, the width W146s of the sidewall portion 146s of the metal silicide liner 146 is not greater than the sum (W132+W133) of the width W132 of the oxide liner 132 and the width W133 of the second nitride liner 133. In FIG. 12, the width W146s of the sidewall portion 146s of the metal silicide liner 146 is equal to the width W132 of the oxide liner 132 and the width W133 of the second nitride liner 133. In this way, the width of the metal plug to be formed subsequently may be maintained, and the offset between the subsequent metal plug and the conductive barrier layer may be prevented.

In some embodiments, the ratio of the width W146s of the sidewall portion 146s of the metal silicide liner 146 and the width W120 of the bit line 120 is between 1%-65%. As being between the above ratio, the contact resistance of the capacitor contact may be reduced without offsetting the subsequent metal plug and the conductive barrier layer. In FIG. 12, the ratio is between 40%-65%.

Figure 13:
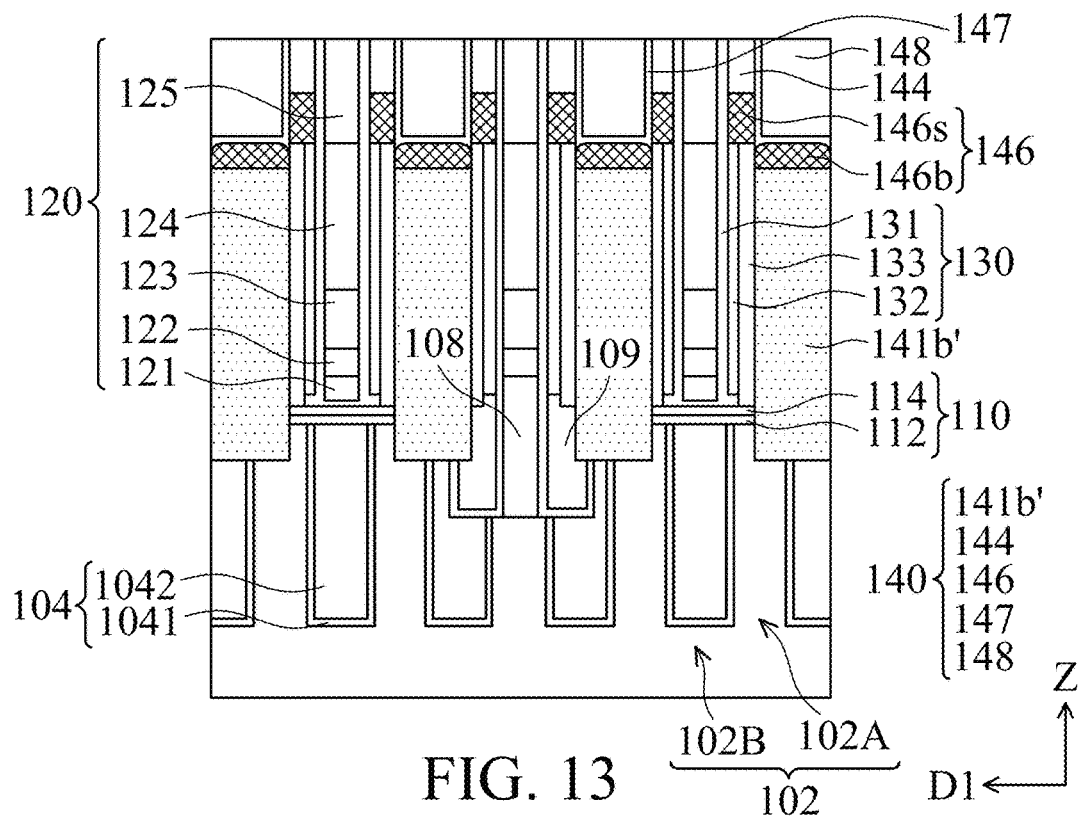

Next, as shown in FIG. 13, an adhesive layer material is formed along the surface of the metal silicide liner 146 by a deposition process and a planarization process. A metal material is then formed on the adhesive layer material. The excess portion is removed by a planarization process to form the adhesive layer 147 and the metal plug 148.

In FIG. 13, the capacitor contact 140 includes a semiconductor plug (only the body portion 141b' in FIG. 13) disposed on the semiconductor substrate 102. The semiconductor plug includes a metal silicide liner 146, a nitride layer 144, and an adhesive layer 147. The metal silicide liner 146 includes the sidewall portion 146s and the bottom portion 146b extending along the sidewalls and the bottom of the metal plug 148 respectively. The nitride layer 144 is disposed on the metal silicide liner 146. The adhesive layer 147 is disposed between the metal silicide liner 146 and the metal plug 148.

In some embodiments, the adhesive layer 147 may increase the adhesion between the metal silicide liner 146 and the metal plug 148. In some embodiments, the top surface of the adhesive layer 147, the top surface of the metal plug 148 and the top surface of the nitride layer 144 are level. In some embodiments, since the adhesive layer 147 is formed along the sidewall portion 146s and the bottom portion 146b of the metal silicide liner 146, the adhesive layer 147 generally presents a U-shape and surrounds the metal plug 148.

In some embodiments, the adhesive layer 147 extends along the sidewall of the nitride layer 144 and sidewalls 146s and bottom 146b of the metal silicide liner 146. The adhesive layer 147 is in direct contact with the nitride layer 144 and the sidewall portion 146s and the bottom portion 146b of the metal silicide liner 146. In some embodiments, the adhesive layer 147 includes titanium (Ti) or titanium nitride (TiN) or the like.

In some embodiments, the top surface of the metal plug 148 is level with the top surface of the nitride layer 144. In some embodiments, in the height direction Z, the top surface of the sidewall portion 146s of the metal silicide liner 146 is lower than the top surface of the metal plug 148. In some embodiments, the sidewall portion 146s of the metal silicide liner 146 and the nitride layer 144 are both disposed between the first nitride liner 131 and the metal plug 148.

In some embodiments, the sidewalls of the upper portion of the metal plug 148 are surrounded by the nitride layer 144, and the sidewalls of the lower portion of the metal plug 148 are surrounded by the sidewall portions 146s of the metal silicide liner 146.

Compared with the case where the metal silicide liner is only disposed on the bottom of the metal plug, in the embodiment of the present disclosure, the metal silicide liner 146 is further disposed on the sidewall of the metal plug 148 to increase the contact area, thereby reducing the resistance of the capacitor contact.

In some embodiments, the bottom surface of the metal plug 148 is not lower than the top surface of the conductive layer 123 of the bit line 120, thereby reducing the capacitance value of the bit line 120 and the capacitor contact 140.

In some embodiments, the semiconductor substrate 102 under the bit line contact 108 has a doped region (not shown), which can serve as a source, and the semiconductor substrate 102 under the capacitor contact 140 also has a doped region (not shown), which can act as a drain. As shown in FIG. 1, in any active region 102A extending along the third direction D3, the arrangement sequence is the capacitor contact 140, the word line 106, the bit line contact 108, the word line 106, the capacitor contact 140, and may act as a drain, a gate, a source, a gate, and a drain, respectively. That is, the active region 102A includes two groups of transistor structures sharing the same source electrode, so that the layout may be much effectively utilized to save the manufacturing cost.

Figure 14:
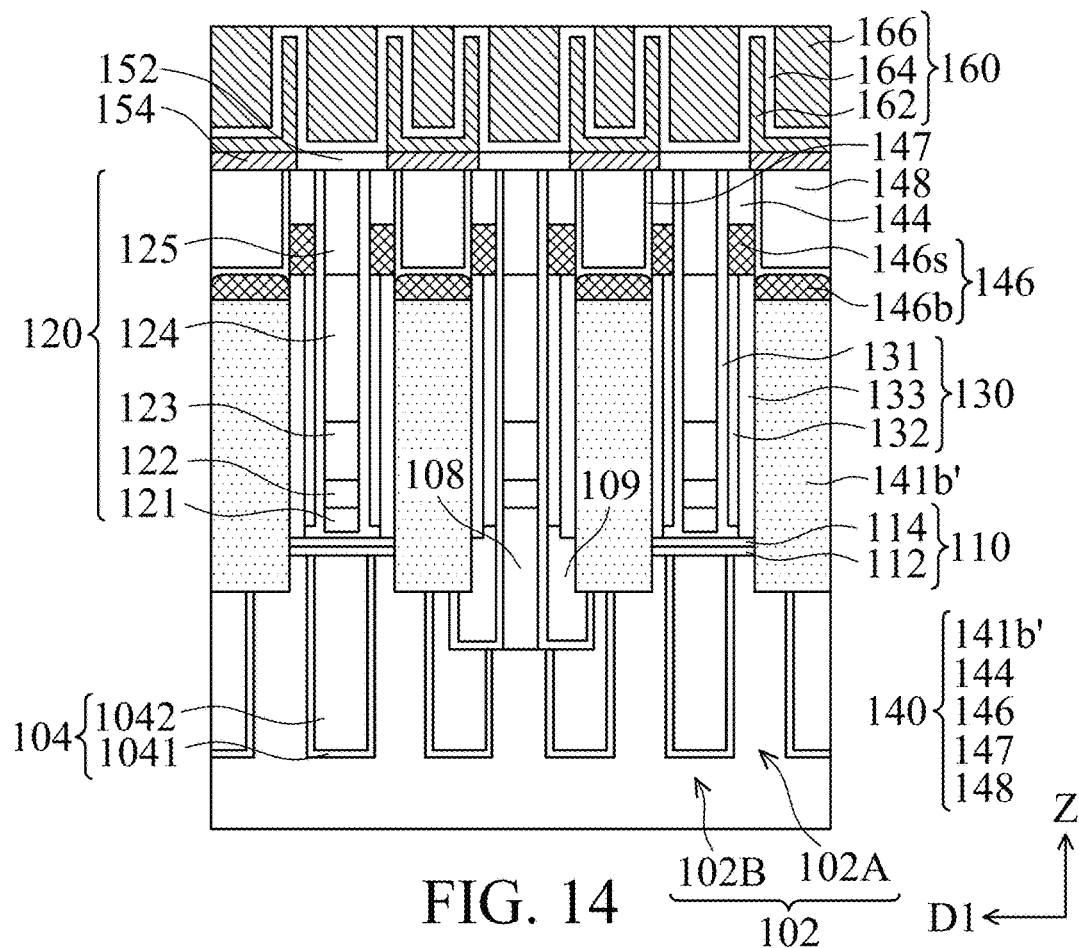

Next, referring to FIG. 14, a dielectric layer 152, a conductive barrier layer 154 and a capacitor structure 160 are formed on the capacitor contact 140 and the bit line 120.

In some embodiments, in the first direction D1, the dielectric layer 152 and the conductive barrier layer 154 are arranged alternately. The conductive barrier layer 154 is directly above the capacitor contact 140 and spans over to the nitride layer 144. In some embodiments, the conductive barrier layer 154 includes a material, such as tungsten or copper, which may block the penetration of an etching solution.

In some embodiments, the capacitor structure 160 includes electrode layers 162 and 166 and a dielectric layer 164 sandwiched therebetween. In some embodiments, the electrode layer 162 is formed on the conductive barrier layer 154 and has a U-shaped cross-sectional profile. In some embodiments, the dielectric layer 164 extends along the electrode layer 162 and the conductive barrier layer 154 and is a continuous film. It should be noted that the capacitor structure 160 in FIG. 14 is only an example, and those with ordinary skill in the art may also apply capacitor structures different from those shown in FIG. 14 on the capacitor contact 140.

In some embodiments, the dielectric layer 164 may include silicon nitride ($Si_3N_4$), aluminum oxide ($Al_2O_3$), yttrium oxide ($Y_2O_3$), titanium oxide (TiO), hafnium dioxide ($HfO_2$), or zirconium dioxide ($ZrO_2$) and so on. In some embodiments, the electrode layers 162 and 166 may include silicon germanium (SiGe), titanium, titanium nitride, tungsten nitride, tantalum or tantalum nitride and so on in order to reduce leakage current.

It should be noted that, after the capacitor structure 160 is formed, additional components, such as metal layers and dielectric layers, may still be formed to complete the fabrication of memory devices such as dynamic random access memory (DRAM).

In summary, in the embodiments of the present disclosure, by forming the sidewalls and the bottom of the metal silicide liner, the uniformity of the metal silicide liner may be improved, and the resistance in the capacitor contacts may also be reduced, thereby improving the semiconductor performance.

Figure 15:
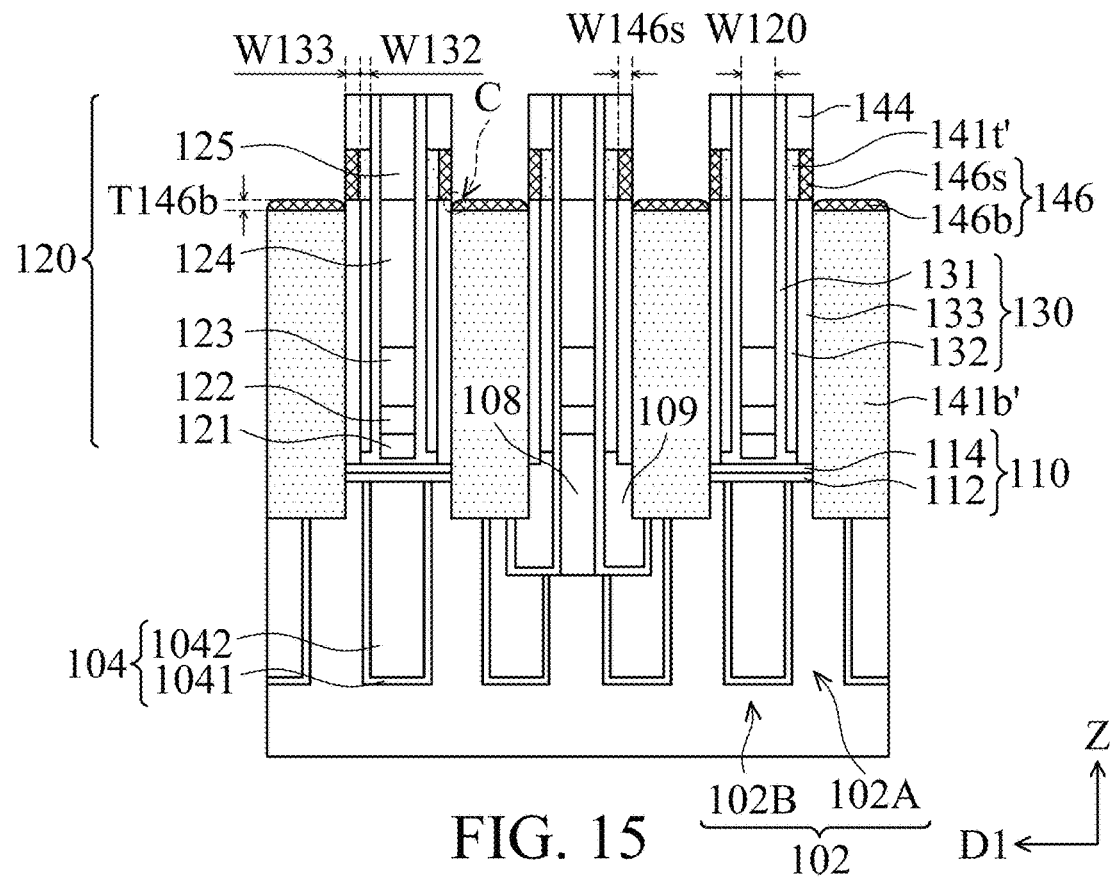
FIGS. 15-16 illustrate cross-sectional views of semiconductor memory structure at different stages, wherein the extending portion of the semiconductor material is not completely silicided, according to other embodiments of the present disclosure.
Figure 16:
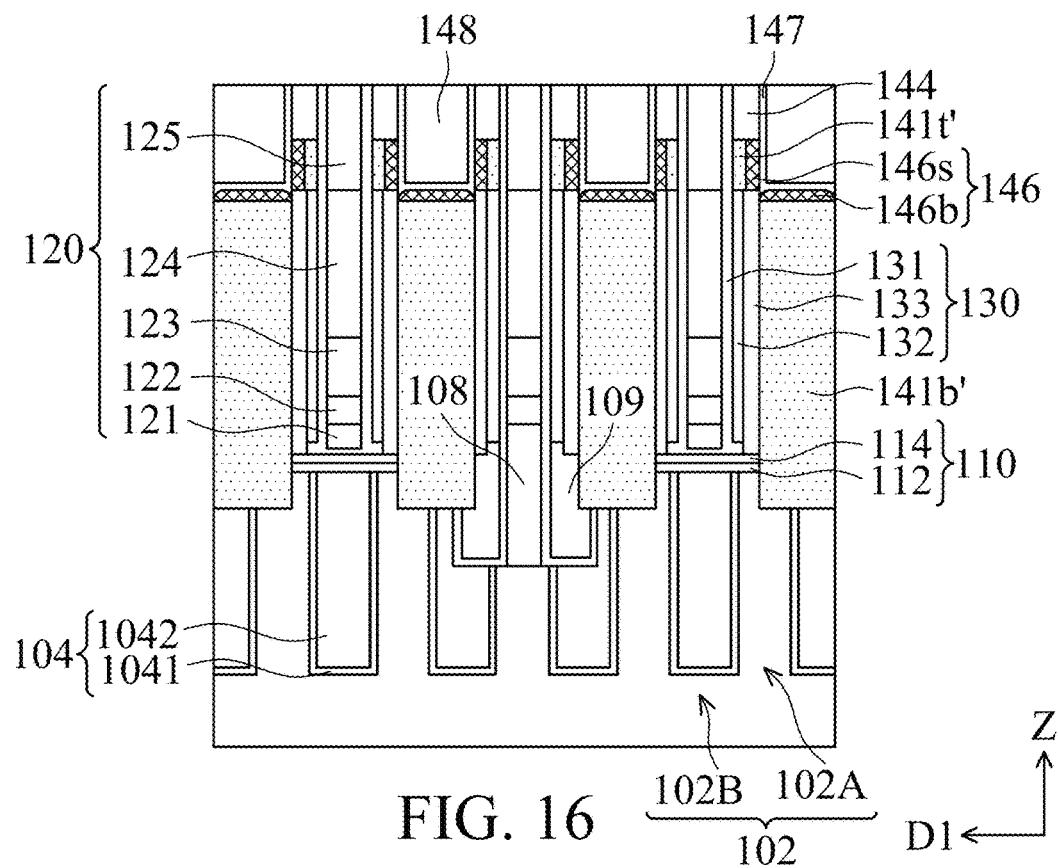

FIGS. 15-16 are cross-sectional views of forming a semiconductor memory structure at different stages according to other embodiments of the present disclosure.

Following FIG. 11, as shown in FIG. 15, a portion of the extending portion 141t extending along the sidewall of the recess 1410 is converted into the sidewall portion 146s of the metal silicide liner 146 by a silicidation process. The portion of the body portion 141b extending along the bottom of the recess 1410 is converted into the bottom portion 146b of the metal silicide liner 146. Here, the remaining semiconductor material 141 is referred to as a semiconductor plug 141, the remaining body portion 141b is referred to as a body portion 141b', and the remaining extending portion 141t is referred to as an extending portion 141t'. In some embodiments, the body portion 141b' is not in contact with the extending portion 141t'.

In FIG. 15, in the height direction Z, the extending portion 141t' is disposed directly above the oxide liner 132. That is, the bottom surface of the extending portion 141t' is in direct contact with the top surface of the oxide liner 132.

In FIG. 15, in the height direction Z, the sidewall of the nitride layer 144, the sidewall of the extending portion 141t', and the sidewall of the oxide liner 132 are aligned with each other. That is, in the height direction Z, the nitride layer 144, the extending portion 141t' and the oxide liner 132 are arranged in sequence from top to bottom. In other words, in the height direction Z, the extending portion 141t' is sandwiched between the nitride layer 144 and the oxide liner 132.

In FIG. 15, the extending portion 141t' is disposed on the sidewall of the first nitride liner 131, and the body portion 141b' is disposed on the sidewall of the second nitride liner 133. In the first direction D1, the extending portion 141t' is disposed between the first nitride liner 131 and the sidewall portion 146s of the metal silicide liner 146.

In FIG. 15, the width W146s of the sidewall portion 146s of the metal silicide liner 146 is less than the sum of the width W132 of the oxide liner 132 and the width W133 of the second nitride liner 133. The width W146s of the sidewall portion 146s of the metal silicide liner 146 is substantially equal to the thickness T146b of the bottom portion 146b. In FIG. 15, the ratio of the width W146s of the sidewall portion 146s of the metal silicide liner 146 and the width W120 of the bit line 120 is between 1%-40% or 5%-30%.

In the embodiment of the present disclosure, the semiconductor plug 141b' further includes the extension portion 141t', which may further reduce the capacitance value of the bit line.

Next, similar to the above-mentioned process, the adhesive layer 147 and the metal plug 148 are formed, and the semiconductor memory structure as shown in FIG. 16 may be obtained.

Figure 17:
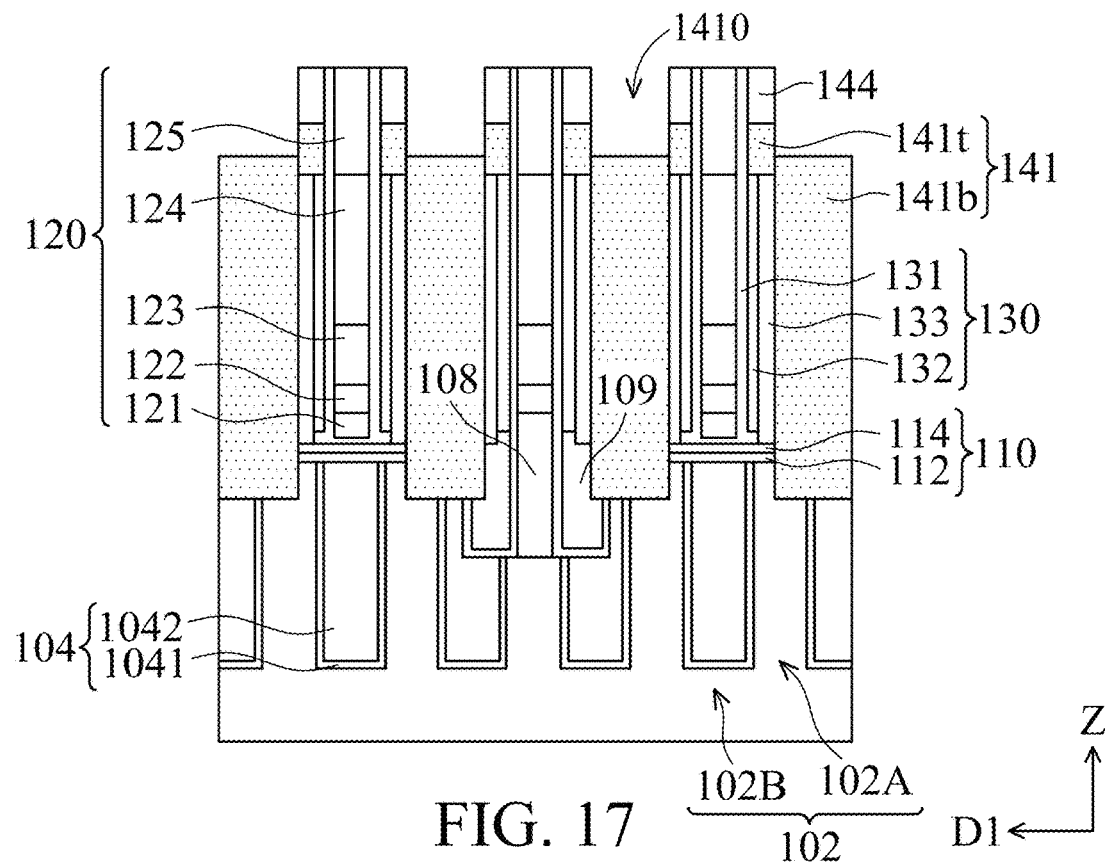
FIGS. 17-18 illustrate cross-sectional views of forming semiconductor memory structure at different stages, wherein in the height direction, the bottom surface of the sidewall portion of the metal silicide layer is lower than the top surface of the bottom portion of the metal silicide liner, according to some other embodiments of the present disclosure.
Figure 18:
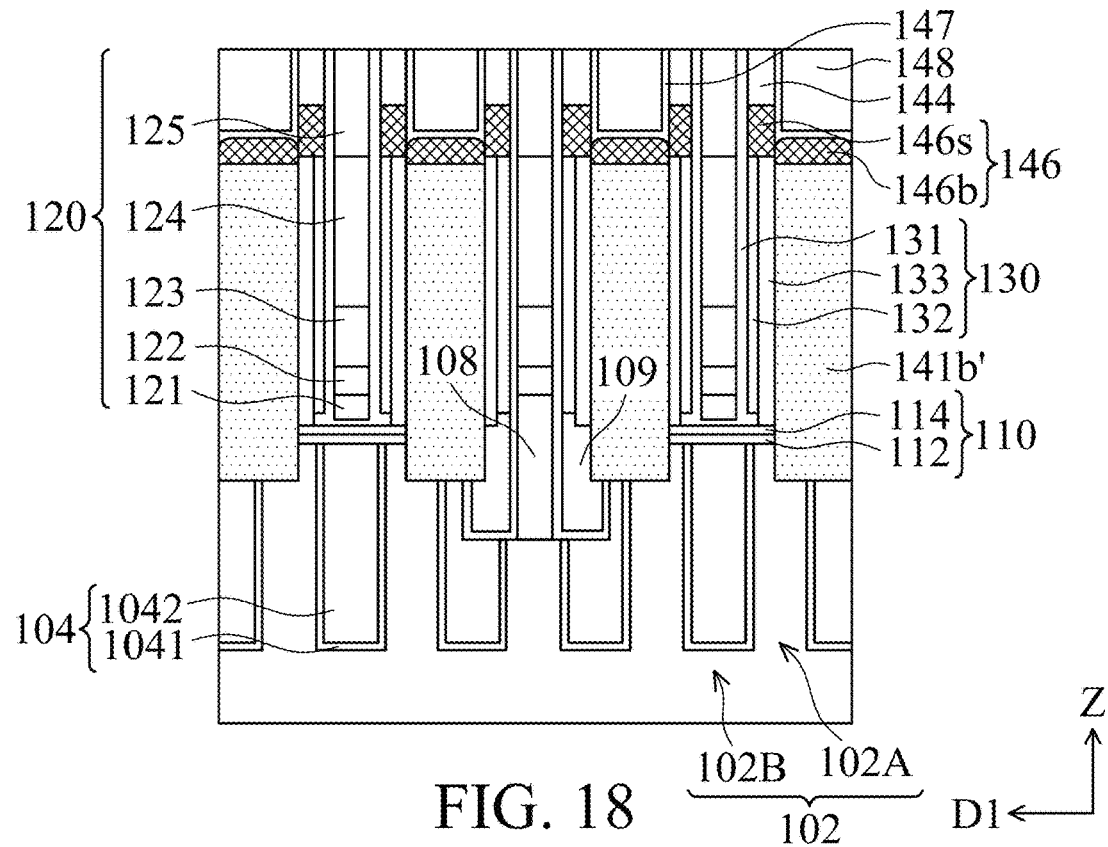

FIGS. 17-18 are cross-sectional views of forming a semiconductor memory structure at different stages according to other embodiments of the present disclosure.

Continuing from FIG. 10, as shown in FIG. 17, a recess 1410 is formed in the semiconductor material 141, and the semiconductor material 141 is divided into an extending portion 141t on the sidewall of the recess 1410 and a body portion 141b under the bottom of the recess. The body portion 141b and a portion of the sidewall of the extending portion 141t are connected to each other by a portion of their sidewalls. The semiconductor memory structure as shown in FIG. 18 may be obtained by a process similar to the above-mentioned process.

FIG. 18 is similar to FIG. 13. The difference between FIG. 18 and FIG. 13 is that in the height direction Z, the bottom surface of the sidewall portion 146s of the metal silicide liner 146 is lower than the top surface of the bottom portion 146b. In this way, the bottom 146b of the metal silicide liner 146 may reduce more effectively different stress and growth temperature at the corners due to different materials, thereby further improving the uniformity.

Figure 19:
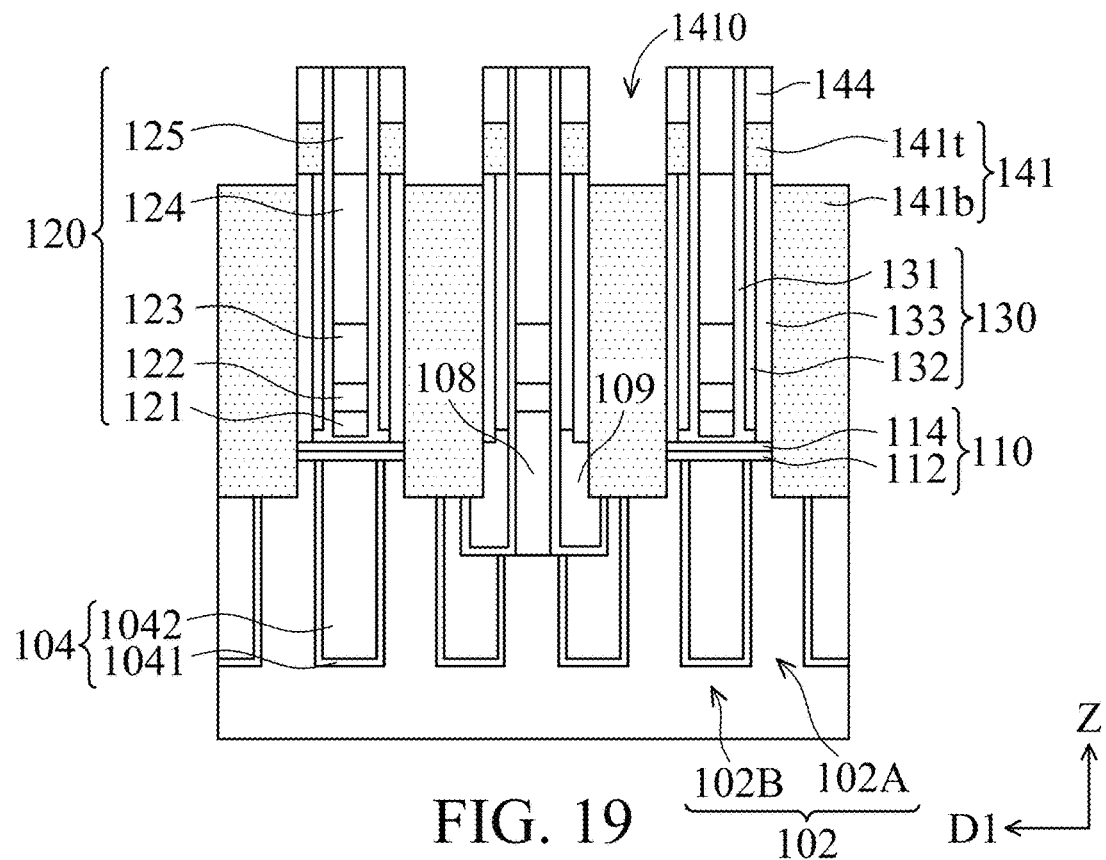
FIGS. 19-20 illustrate cross-sectional views of forming semiconductor memory structure at different stages, wherein in the height direction, the bottom surface of the sidewall portion of the metal silicide layer is higher than the top surface of the bottom portion of the metal silicide liner, according to further some other embodiments of the present disclosure.
Figure 20:
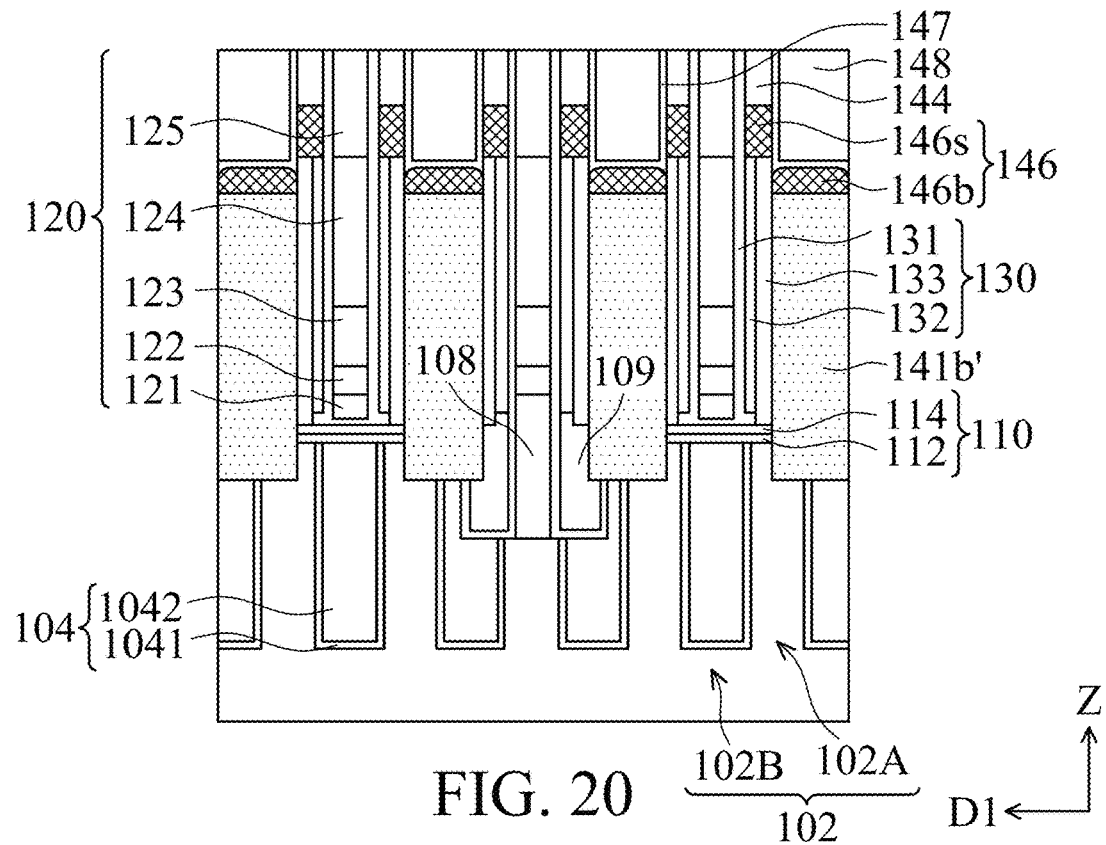

FIGS. 19-20 are cross-sectional views of forming a semiconductor memory structure at different stages according to some other embodiments of the present disclosure.

Following FIG. 10, as shown in FIG. 19, a recess 1410 is formed in the semiconductor material 141, and the semiconductor material 141 is divided into an extending portion 141t on the sidewall of the recess 1410 and a bottom portion 141b under the bottom of the recess. The body portion 141b is not connected to the sidewall of the extending portion 141t (or when the body portion 141b and the extending portion 141t are projected to the height direction Z, they do not contact each other). The semiconductor memory structure shown in FIG. 20 may be obtained by a process similar to the above-mentioned process.

FIG. 20 is similar to FIG. 18. The difference between FIG. 20 and FIG. 18 is that in the height direction Z, the bottom surface of the sidewall portion 146s of the metal silicide liner 146 is higher than the top surface of the bottom portion 146b. In this way, the contact area of the metal plug may be increased, thereby reducing the resistance in the capacitor contact.

In summary, the embodiments of the present disclosure may reduce the resistance of the capacitor contacts and improve the uniformity of the metal silicide liner by disposing the sidewall portion of the metal silicide liner on both sides of the metal plug. In addition, the capacitance value of the bit line may be further reduced by disposing the extending portion of the semiconductor plug on the sidewall portion of the metal silicide liner.

Although the present invention is disclosed in the foregoing embodiments, it is not intended to limit the present invention. Those with ordinary skill in the technical field to which the present invention pertains can make some changes and modifications without departing from the spirit and scope of the present invention. Therefore, the scope of protection of the present invention shall be subject to those defined by the scope of the appended claims.

What is claimed is:

1. A semiconductor memory structure, comprising:
   a semiconductor substrate;
   a bit line disposed on the semiconductor substrate;
   a dielectric liner disposed on a sidewall of the bit line, wherein the dielectric liner comprises:
      a first nitride liner disposed on a sidewall of the bit line;
      an oxide liner disposed on a sidewall of the first nitride liner; and
      a second nitride liner disposed on a sidewall of the oxide liner; and
   a capacitor contact disposed on a side of the bit line, wherein the capacitor contact comprises:
      a semiconductor plug disposed on the semiconductor substrate;
      a metal plug disposed on the semiconductor plug;
      a metal silicide liner comprising a sidewall portion and a bottom portion respectively extending along a sidewall and a bottom of the metal plug, wherein the sidewall portion is disposed directly above the second nitride liner; and
      a nitride layer disposed on the metal silicide liner.

2. The semiconductor memory structure as claimed in claim 1, wherein the sidewall portion is not in direct contact with the bottom portion.

3. The semiconductor memory structure as claimed in claim 1, wherein the sidewall portion is disposed between the first nitride liner and the metal plug.

4. The semiconductor memory structure as claimed in claim 1, wherein in a height direction, the sidewall portion is sandwiched between the nitride layer and the second nitride liner.

5. The semiconductor memory structure as claimed in claim 1, wherein the sidewall portion is disposed on the sidewall of the first nitride liner and the bottom portion is disposed on a sidewall of the second nitride liner.

6. The semiconductor memory structure as claimed in claim 1, wherein the nitride layer is disposed between the first nitride liner and the metal plug.

7. The semiconductor memory structure as claimed in claim 1, wherein a sidewall of the nitride layer, a sidewall of the sidewall portion and a sidewall of the second nitride liner are aligned with each other.

8. The semiconductor memory structure as claimed in claim 1, wherein the sidewall portion is in direct contact with the oxide liner.

9. The semiconductor memory structure as claimed in claim 1, wherein the semiconductor plug comprises a body portion disposed under the bottom portion and an extending portion disposed on a sidewall of the sidewall portion, wherein the body portion is not in contact with the extending portion.

10. The semiconductor memory structure as claimed in claim 9, wherein the extending portion is disposed directly above the oxide liner.

11. The semiconductor memory structure as claimed in claim 9, wherein in a height direction, the extending portion is sandwiched between the nitride layer and the oxide liner.

12. The semiconductor memory structure as claimed in claim 9, wherein the extending portion is disposed on a sidewall of the first nitride liner, and the body portion is disposed on a sidewall of the second nitride liner.

13. The semiconductor memory structure as claimed in claim 9, wherein the extending portion is disposed between the first nitride liner and the sidewall portion.

14. The semiconductor memory structure as claimed in claim 1, wherein in a top view, the nitride layer is in direct contact with the first nitride liner, the oxide liner, and the second nitride liner.

15. The semiconductor memory structure as claimed in claim 1, wherein a width of the sidewall portion is substantially equal to a thickness of the bottom portion.

16. The semiconductor memory structure as claimed in claim 1, wherein a width of the sidewall portion is less than or equal to a sum of a width of the oxide liner and a width of the second nitride liner.

17. The semiconductor memory structure as claimed in claim 1, wherein a ratio of a width of the sidewall portion and a width of the bit line is 1%-65%.

18. The semiconductor memory structure as claimed in claim 1, wherein the nitride layer surrounds an upper portion of the metal plug and the sidewall portion surrounds a lower portion of the metal plug.

19. The semiconductor memory structure as claimed in claim 1, wherein the bit line comprises a conductive layer, wherein a top surface of the conductive layer is not higher than a bottom surface of the metal plug.

20. The semiconductor memory structure as claimed in claim 1, wherein the capacitor contact further comprises an adhesive layer disposed between the metal silicide liner and the metal plug.

* * * * *